United States Patent
Gill et al.

(10) Patent No.: US 6,219,212 B1
(45) Date of Patent: Apr. 17, 2001

(54) MAGNETIC TUNNEL JUNCTION HEAD STRUCTURE WITH INSULATING ANTIFERROMAGNETIC LAYER

(75) Inventors: Hardayal Singh Gill, Portola Valley; Douglas Johnson Werner, Fremont, both of CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/149,900

(22) Filed: Sep. 8, 1998

(51) Int. Cl.$^7$ ........................................... G11B 5/33
(52) U.S. Cl. ............................................. 360/324.2
(58) Field of Search ................... 360/324.2; 324/252, 324/207.21; 338/32 R, 32 H

(56) References Cited

U.S. PATENT DOCUMENTS

| | | | |
|---|---|---|---|
| 5,206,590 | 4/1993 | Dieny et al. | 324/252 |
| 5,390,061 | * 2/1995 | Nakatani et al. | 360/324.2 |
| 5,508,866 | * 4/1996 | Gill et al. | 360/113 |
| 5,636,093 | 6/1997 | Gijs et al. | 360/126 |
| 5,650,958 | 7/1997 | Gallagher et al. | 365/173 |
| 5,657,191 | 8/1997 | Yuan | 360/113 |
| 5,668,688 | 9/1997 | Dykes et al. | 360/113 |
| 5,701,222 | * 12/1997 | Gill et al. | 360/113 |
| 5,876,848 | * 3/1999 | Tan et al. | 428/336 |
| 5,923,505 | * 7/1999 | Kroes et al. | 360/113 |
| 5,930,087 | 7/1999 | Brug et al. | 360/113 |
| 5,966,012 | * 10/1999 | Parkin | 324/252 |
| 5,986,858 | * 11/1999 | Sato et al. | 360/113 |
| 6,097,579 | * 8/2000 | Gill | 360/324.2 |

FOREIGN PATENT DOCUMENTS

| | | |
|---|---|---|
| 0783112 | 12/1996 | (EP) . |
| 2743930 | 1/1997 | (FR) . |
| 7296340 | 4/1994 | (JP) . |
| 8329426 | 5/1995 | (JP) . |

OTHER PUBLICATIONS

"Spin Valve Read Head with Fe/Al2O3/Fe/NiFe Tunneling Junction", IBM Technical Disclosure Bulletin, vol. 40, No. 4, Apr. 1997, pp. 97–98.

J. C. Slonczewski, "Magnetic–Field Tunnel–Sensor", IBM Technical Disclosure Bulletin, vol. 19, No. 6, Nov. 1976, pp. 2331–2332.

R. Rottmayer et al., "A New Design For An Ultra–High Density Magnetic Recording Head Using a GMR Sensor In The CPP Mode", IEEE Trans. on Magnetics, vol. 31, No. 6, Nov. 1995, pp. 2597–2599.

* cited by examiner

Primary Examiner—Brian E. Miller
(74) Attorney, Agent, or Firm—William D. Gill

(57) ABSTRACT

A magnetic tunnel junction (MTJ) device for use as a magnetic field sensor in a magnetic disk drive or as a memory cell in a magnetic random access (MRAM) array has an antiferromagnetic (AFM) layer formed of electrically insulating antiferromagnetic material. The magnetic tunnel junction in the sensor is formed on a first shield, which also serves as an electrical lead, and is made up of a stack of layers forming an MTJ sensor stripe. The layers in the stack are an AFM layer, a pinned ferromagnetic layer exchange biased with the AFM layer so that its magnetic moment cannot rotate in the presence of an applied magnetic field, a free ferromagnetic layer whose magnetic moment is free to rotate in the presence of an applied magnetic field, and an insulating tunnel barrier layer disposed between the pinned layer and the free layer. The MTJ sensor stripe is generally rectangularly shaped with parallel side edges and a back edge and a front edge at the air bearing surface (ABS). The pinned layer extends away from the ABS beyond the back edge of the AFM layer to contact the first shield providing a path for sensing current to bypass the electrically insulating AFM layer and flow to the tunnel junction layer. A layer of electrically insulating material isolates the pinned layer and the first shield from the second shield which also serves as an electrical lead for the MTJ sensor.

35 Claims, 9 Drawing Sheets

MAGNETIC TUNNEL JUNCTION HEAD STRUCTURE WITH INSULATING ANTIFERROMAGNETIC LAYER

BACKGROUND OF THE INVENTION

1. Field of the Invention

This invention relates in general to magnetic tunnel junction transducers for reading information signals from a magnetic medium and, in particular, to a magnetic tunnel junction sensor with an electrically insulating antiferromagnetic layer, and to magnetic storage systems which incorporate such sensors.

2. Description of Related Art

Computers often include auxiliary memory storage devices having media on which data can be written and from which data can be read for later use. A direct access storage device (disk drive) incorporating rotating magnetic disks is commonly used for storing data in magnetic form on the disk surfaces. Data is recorded on concentric, radially spaced tracks on the disk surfaces. Magnetic heads including read sensors are then used to read data from the tracks on the disk surfaces.

In high capacity disk drives, magnetoresistive (MR) read sensors, commonly referred to as MR sensors, are the prevailing read sensors because of their capability to read data from a surface of a disk at greater track and linear densities than thin film inductive heads. An MR sensor detects a magnetic field through the change in the resistance of its MR sensing layer (also referred to as an "MR element") as a function of the strength and direction of the magnetic flux being sensed by the MR layer.

The conventional MR sensor operates on the basis of the anisotropic magnetoresistive (AMR) effect in which an MR element resistance varies as the square of the cosine of the angle between the magnetization in the MR element and the direction of sense current flowing through the MR element. Recorded data can be read from a magnetic medium because the external magnetic field from the recorded magnetic medium (the signal field) causes a change in the direction of magnetization in the MR element, which in turn causes a change in resistance in the MR element and a corresponding change in the sensed current or voltage.

Another type of MR sensor is the giant magnetoresistance (GMR) sensor manifesting the GMR effect. In GMR sensors, the resistance of the MR sensing layer varies as a function of the spin-dependent transmission of the conduction electrons between magnetic layers separated by a non-magnetic layer (spacer) and the accompanying spin-dependent scattering which takes place at the interface of the magnetic and non-magnetic layers and within the magnetic layers. sensors using only two layers of ferromagnetic material (e.g., Ni—Fe) separated by a layer of non-magnetic material (e.g., copper) are generally referred to as spin valve (SV) sensors manifesting the SV effect.

FIG. 1 shows a prior art SV sensor 100 comprising end regions 104 and 106 separated by a central region 102. A first ferromagnetic layer, referred to as a pinned layer 120, has its magnetization typically fixed (pinned) by exchange coupling with an antiferromagnetic (AFM) layer 125. The magnetization of a second ferromagnetic layer, referred to as a free layer 110, is not fixed and is free to rotate in response to the magnetic field from the recorded magnetic medium (the signal field). The free layer 110 is separated from the pinned layer 120 by a non-magnetic, electrically conducting spacer layer 115. Hard bias layers 130 and 135 formed in the end regions 104 and 106, respectively, provide longitudinal bias for the free layer 110. Leads 140 and 145 formed on hard bias layers 130 and 135, respectively, provide electrical connections for sensing the resistance of SV sensor 100. IBM's U.S. Pat. No. 5,206,590 granted to Dieny et al., incorporated herein by reference, discloses a GMR sensor operating on the basis of the SV effect.

Another type of magnetic device currently under development is a magnetic tunnel junction (MTJ) device. The MTJ device has potential applications as a memory cell and as a magnetic field sensor. The MTJ device comprises two ferromagnetic layers separated by a thin, electrically insulating, tunnel barrier layer. The tunnel barrier layer is sufficiently thin that quantum-mechanical tunneling of charge carriers occurs between the ferromagnetic layers. The tunneling process is electron spin dependent, which means that the tunneling current across the junction depends on the spin-dependent electronic properties of the ferromagnetic materials and is a function of the relative orientation of the magnetic moments, or magnetization directions, of the two ferromagnetic layers. In the MTJ sensor, one ferromagnetic layer has its magnetic moment fixed, or pinned, and the other ferromagnetic layer has its magnetic moment free to rotate in response to an external magnetic field from the recording medium (the signal field). When an electric potential is applied between the two ferromagnetic layers, the sensor resistance is a function of the tunneling current across the insulating layer between the ferromagnetic layers. Since the tunneling current that flows perpendicularly through the tunnel barrier layer depends on the relative magnetization directions of the two ferromagnetic layers, recorded data can be read from a magnetic medium because the signal field causes a change of direction of magnetization of the free layer, which in turn causes a change in resistance of the MTJ sensor and a change in the sensed current or voltage. IBM's U.S. Pat. No. 5,650,958 granted to Gallagher et al., incorporated in its entirety herein by reference, discloses an MTJ sensor operating on the basis of the magnetic tunnel junction effect.

FIG. 2a shows a prior art MTJ sensor 200 comprising a first electrode 204, a second electrode 202, and a tunnel barrier layer 215. The first electrode 204 comprises a pinned layer (pinned ferromagnetic layer) 220, an antiferromagnetic (AFM) layer 230, and a seed layer 240. The magnetization of the pinned layer 220 is fixed through exchange coupling with the AFM layer 230. The second electrode 202 comprises a free layer (free ferromagnetic layer) 210 and a cap layer 205. The free layer 210 is separated from the pinned layer 220 by a non-magnetic, electrically insulating tunnel barrier layer 215. In the absence of an external magnetic field, the free layer 210 has its magnetization oriented in the direction shown by arrow 212, that is, generally perpendicular to the magnetization direction of the pinned layer 220 shown by arrow 222 (tail of an arrow pointing into the plane of the paper). A first lead 260 and a second lead 265 formed in contact with first electrode 204 and second electrode 202, respectively, provide electrical connections for the flow of sensing current $I_S$ from a current source 270 to the MTJ sensor A signal detector 280, typically including a recording channel such as a partial-response maximum-likelihood (PRML) channel, connected to the first and second leads 260 and 265 senses the change in resistance due to changes induced in the free layer 210 by the external magnetic field.

FIG. 2b is a cross-sectional view perpendicular to the air bearing surface of the prior art MTJ sensor 200. The MTJ sensor 200 comprises a sensor stripe 290 having a front edge 291 at the ABS and extending away from the ABS to a back edge 292 defined by the back edge of the tunnel barrier layer 215. The leads 260, 265 provide electrical connections for the flow of the sensing current $I_S$ in a direction perpendicular to the tunnel barrier layer 215. An electrical insulating layer 250 prevents shunting of the sensing current around the tunnel barrier layer at the back edge 292 of the sensor stripe 290.

Since, in an MTJ sensor, the sensing current flows in a direction perpendicular to the tunnel barrier layer, a reasonably high electrical conductivity is needed for all the layers disposed between the lead layers except for the tunnel barrier layer. One of these layers is the AFM layer used to fix (pin) the magnetization direction of the ferromagnetic pinned layer. Mn-Fe is an antiferromagnet with good electrical conductivity that has been used in previous MTJ sensors. However, Mn-Fe has poor corrosion resistance which is a concern during the fabrication process and undesirable for long term stability of the MTJ sensor in a disk drive environment. Alternate AFM materials that have high corrosion resistance are NiO and $\alpha$-$Fe_2O_3$/NiO bilayer, however these AFM materials are electrically insulating and therefore do not provide a path for the sensing current to flow between the leads in a direction perpendicular to the tunnel barrier layer with the usual MTJ sensor structure.

What is needed is a structure for an MTJ sensor which allows the use of electrically insulating AFM materials, such as NiO and $\alpha$-$Fe_2O_3$/NiO with their high corrosion resistance, for the pinning layer used to fix the magnetization of the pinned layer and a process for fabrication of an MTJ sensor with this structure.

SUMMARY OF THE INVENTION

It is an object of the present invention to disclose a magnetoresistive tunnel junction (MTJ) sensor having an electrically insulating AFM layer.

It is another object of the present invention to disclose an MTJ sensor having an AFM layer made of NiO.

It is yet another object of the present invention to disclose an MTJ sensor using an electrically insulating AFM layer and having a pinned layer structure in electrical contact to a magnetic shield, the shield also serving as an electrical lead.

In accordance with the principles of the present invention, there is disclosed an MTJ sensor comprising an MTJ sensor stripe having a generally rectangular shape and two opposite side edges, a back edge and a front edge at the ABS surface. The sensor stripe includes a stack of layers including an AFM layer of NiO, an insulating antiferromagnetic material. A ferromagnetic pinned layer deposited on the AFM layer makes electrical contact with a ferromagnetic first shield behind the back edge of the MTJ sensor stripe (the edge opposite to the front edge of the stripe at the air bearing surface) to provide a path for the sensing current to bypass the electrically insulating AFM layer. The sensing current then flows from the pinning layer transversely through the tunnel barrier layer and the free layer of the MTJ sensor stripe to the ferromagnetic second shield which serves as a second electrical lead for the MTJ sensor.

The MTJ sensor comprises a seed layer, an AFM layer, a pinned ferromagnetic layer, a tunnel barrier layer, a free ferromagnetic layer and a cap layer sequentially deposited on the first shield. After deposition of the seed layer and the AFM layer, the AFM layer is defined by photolithography to have an AFM back edge extending beyond the back edge of the sensor stripe. The pinned ferromagnetic layer is deposited on the AFM layer, over the AFM back edge and on the first shield making electrical contact with the first shield.

The tunnel barrier layer, free layer and cap layer are then deposited sequentially and patterned by photolithography to form the MTJ sensor stripe. An electrically insulating layer is then deposited over the entire MTJ sensor area. The photoresist covering the MTJ sensor stripe is then removed and the second shield of ferromagnetic material is deposited over the MTJ sensor making direct electrical contact with the second electrode of the MTJ sensor stripe.

In the MTJ sensor structure of the present invention, the ferromagnetic first and second shield layers provide magnetic shielding from stray magnetic fields as is known to the art and also provide the electrical leads to supply sensing current to the first and second electrodes, respectively, of the MTJ stack. Because the AFM layer used in this embodiment is electrically insulating, direct contact between the first shield and the pinned layer beyond the back edge of the sensor stripe provides the sensing current path to the first electrode of the MTJ sensor. The electrically insulating layer of material at the end regions of the MTJ sensor and at the back edge of the sensor stripe prevent sensing current flow from being shunted around the tunnel barrier layer between the first and second shields.

The above, as well as additional objects, features, and advantages of the present invention will become apparent in the following detailed written description.

BRIEF DESCRIPTION OF THE DRAWINGS

For a fuller understanding of the nature and advantages of the present invention, as well as the preferred mode of use, reference should be made to the following detailed description read in conjunction with the accompanying drawings. In the following drawings, like reference numerals designate like or similar parts throughout the drawings.

DETAILED DESCRIPTION OF THE PREFERRED EMBODIMENT

The following description is the best embodiment presently contemplated for carrying out the present invention. This description is made for the purpose of illustrating the general principles of the present invention and is not meant to limit the inventive concepts claimed herein.

Figure 1:
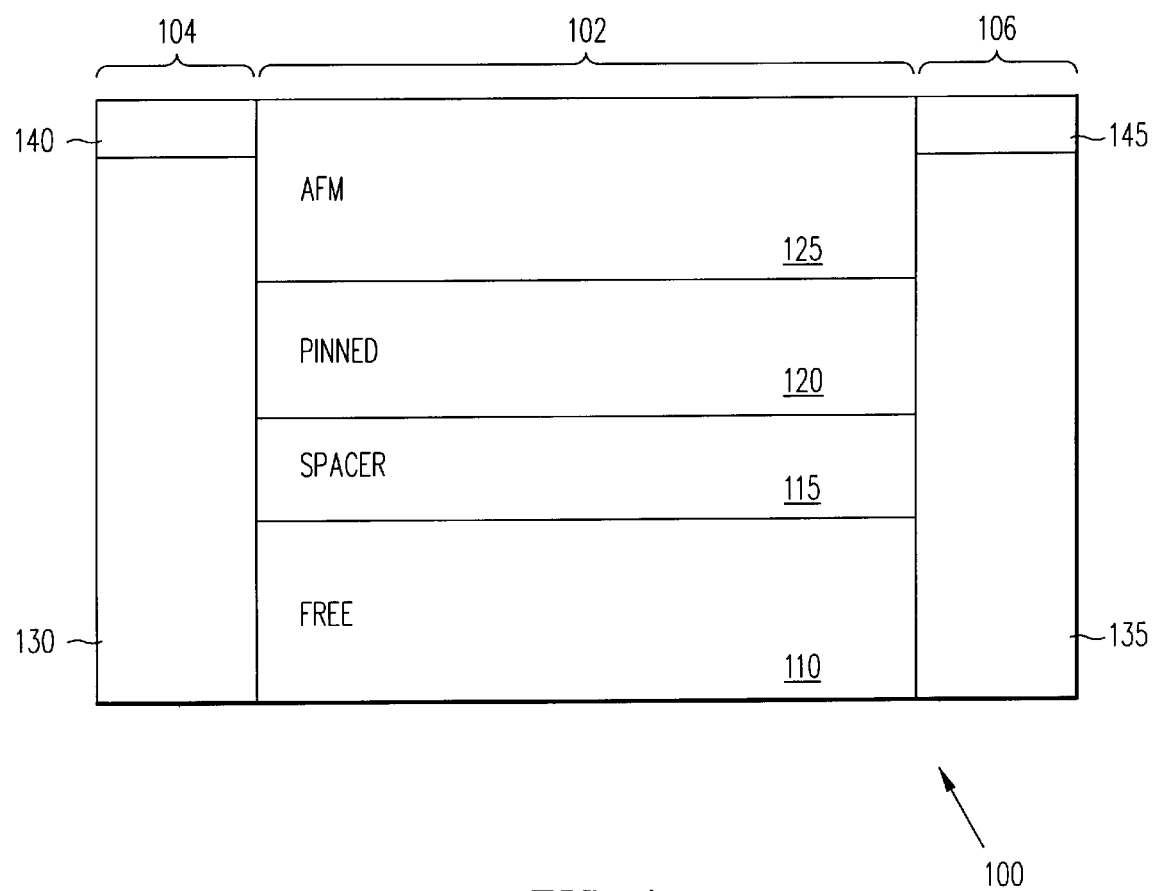
FIG. 1 is an air bearing surface view, not to scale, of a prior art SV sensor.
Figure 2A:
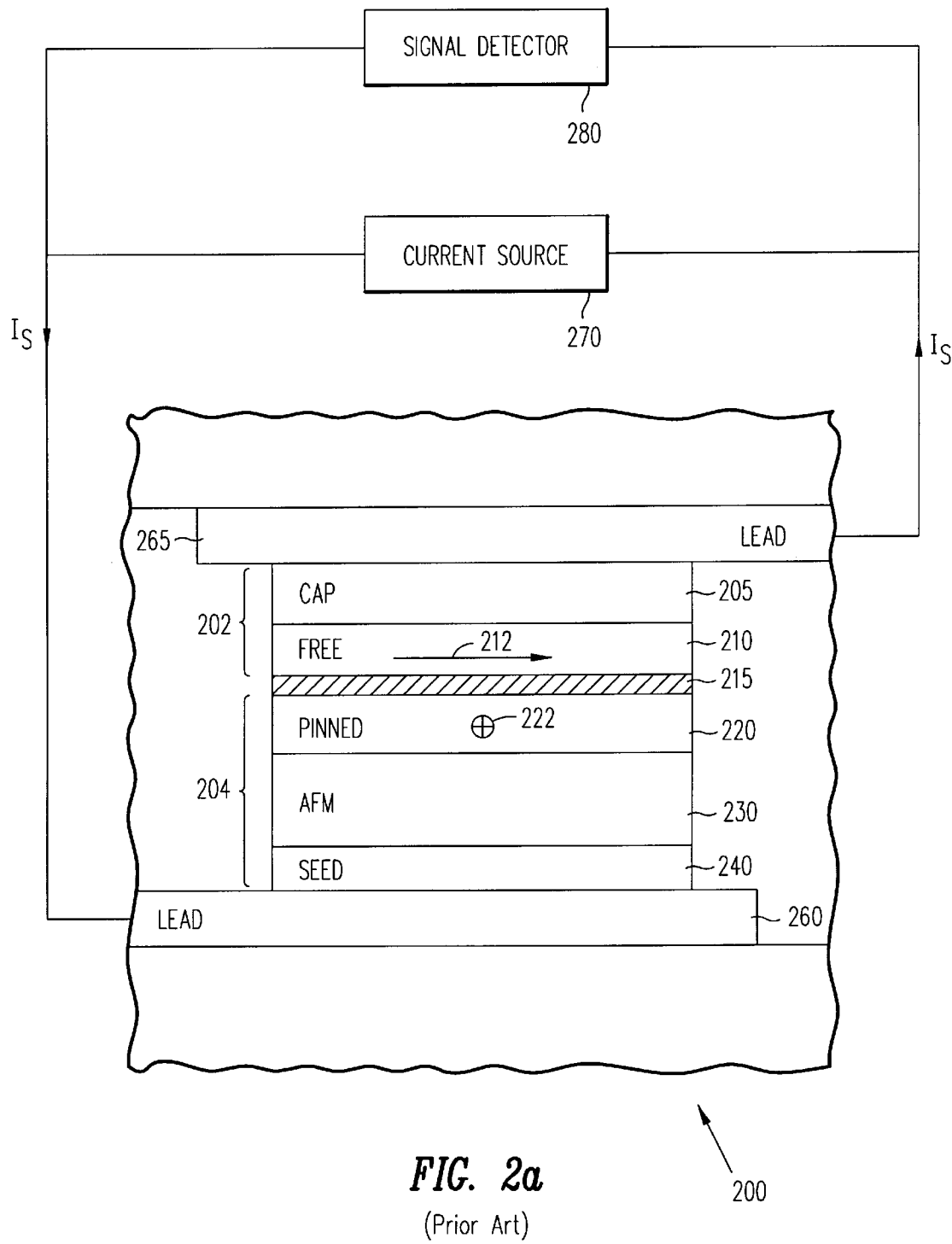
FIG. 2a is an air bearing surface view, not to scale, of a prior art magnetic tunnel junction sensor.
Figure 2B:
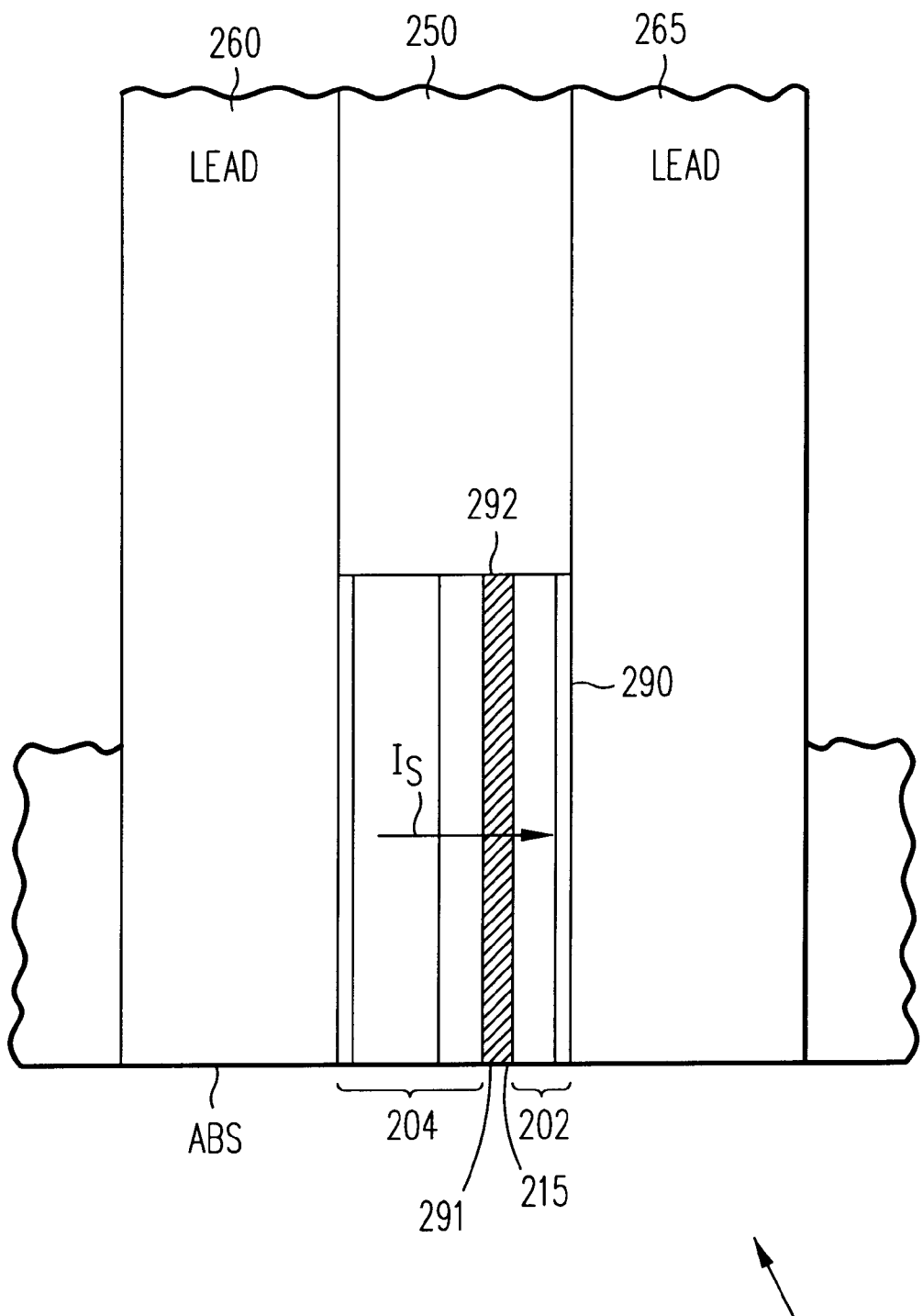
FIG. 2b is a cross-section, not to scale, perpendicular to the air bearing surface of a prior art magnetic tunnel junction sensor.
Figure 3A:
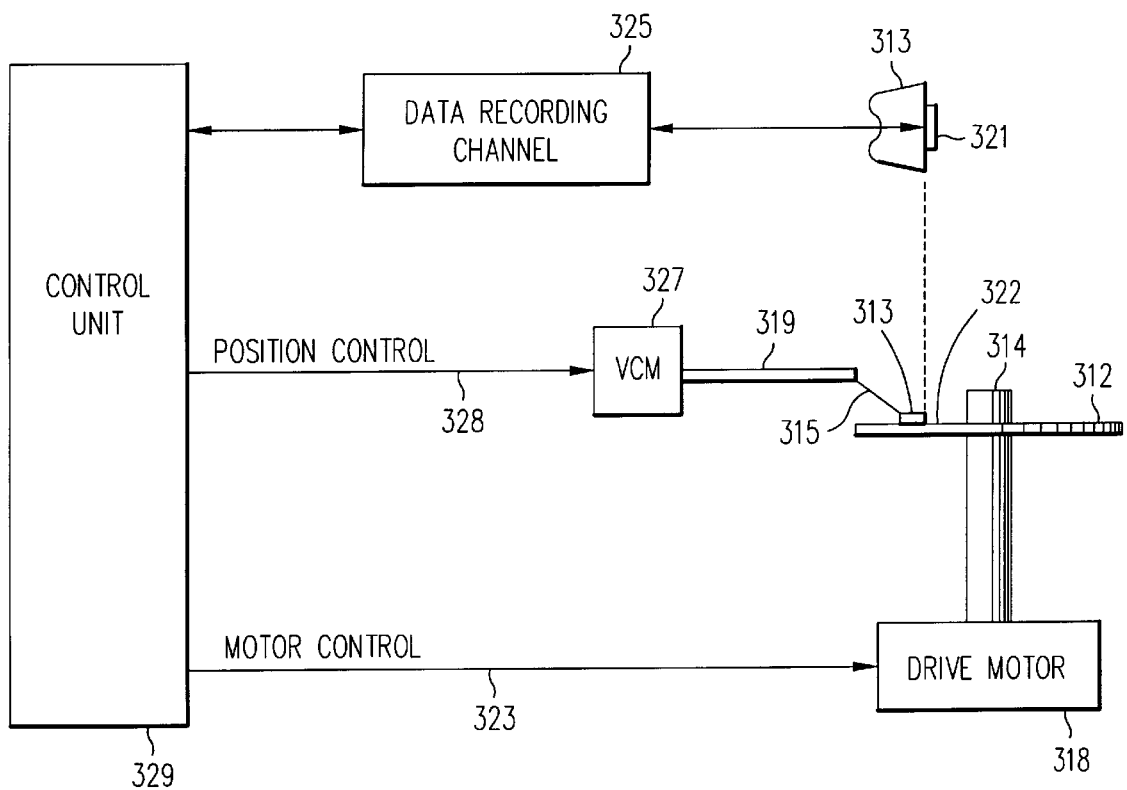
FIG. 3a is a simplified drawing of a magnetic recording disk drive system.

Referring now to FIG. 3, there is shown a disk drive 300 embodying the present invention. As shown in FIG. 3, at least one rotatable magnetic disk 312 is supported on a spindle 314 and rotated by a disk drive motor 318. The magnetic recording media on each disk is in the form of an annular pattern of concentric data tracks (not shown) on the disk 312.

At least one slider 313 is positioned on the disk 312, each slider 313 supporting one or more magnetic read/write heads 321 where the head 321 incorporates the MTJ sensor of the present invention. As the disks rotate, the slider 313 is moved radially in and out over the disk surface 322 so that the heads 321 may access different portions of the disk where desired data is recorded. Each slider 313 is attached to an actuator arm 319 by means of a suspension 315. The suspension 315 provides a slight spring force which biases the slider 313 against the disk surface 322. Each actuator arm 319 is attached to an actuator 327. The actuator as shown in FIG. 3 may be a voice coil motor (VCM). The VCM comprises a coil movable within a fixed magnetic field, the direction and speed of the coil movements being controlled by the motor current signals supplied by a controller 329.

During operation of the disk storage system, the rotation of the disk 312 generates an air bearing between the slider 313 (the surface of the slider 313 which includes the head 321 and faces the surface of the disk 312 is referred to as an air bearing surface (ABS)) and the disk surface 322 which exerts an upward force or lift on the slider. The air bearing thus counterbalances the slight spring force of the suspension 315 and supports the slider 313 off and slightly above the disk surface by a small, substantially constant spacing during normal operation.

The various components of the disk storage system are controlled in operation by control signals generated by the control unit 329, such as access control signals and internal clock signals. Typically, the control unit 329 comprises logic control circuits, storage chips and a microprocessor. The control unit 329 generates control signals to control various system operations such as drive motor control signals on line 323 and head position and seek control signals on line 328. The control signals on line 328 provide the desired current profiles to optimally move and position the slider 313 to the desired data track on the disk 312. Read and write signals are communicated to and from the read/write heads 321 by means of the recording channel 325.

The above description of a typical magnetic disk storage system, and the accompanying illustration of FIG. 3 are for representation purposes only. It should be apparent that disk storage systems may contain a large number of disks and actuators, and each actuator may support a number of sliders.

Figure 3B:
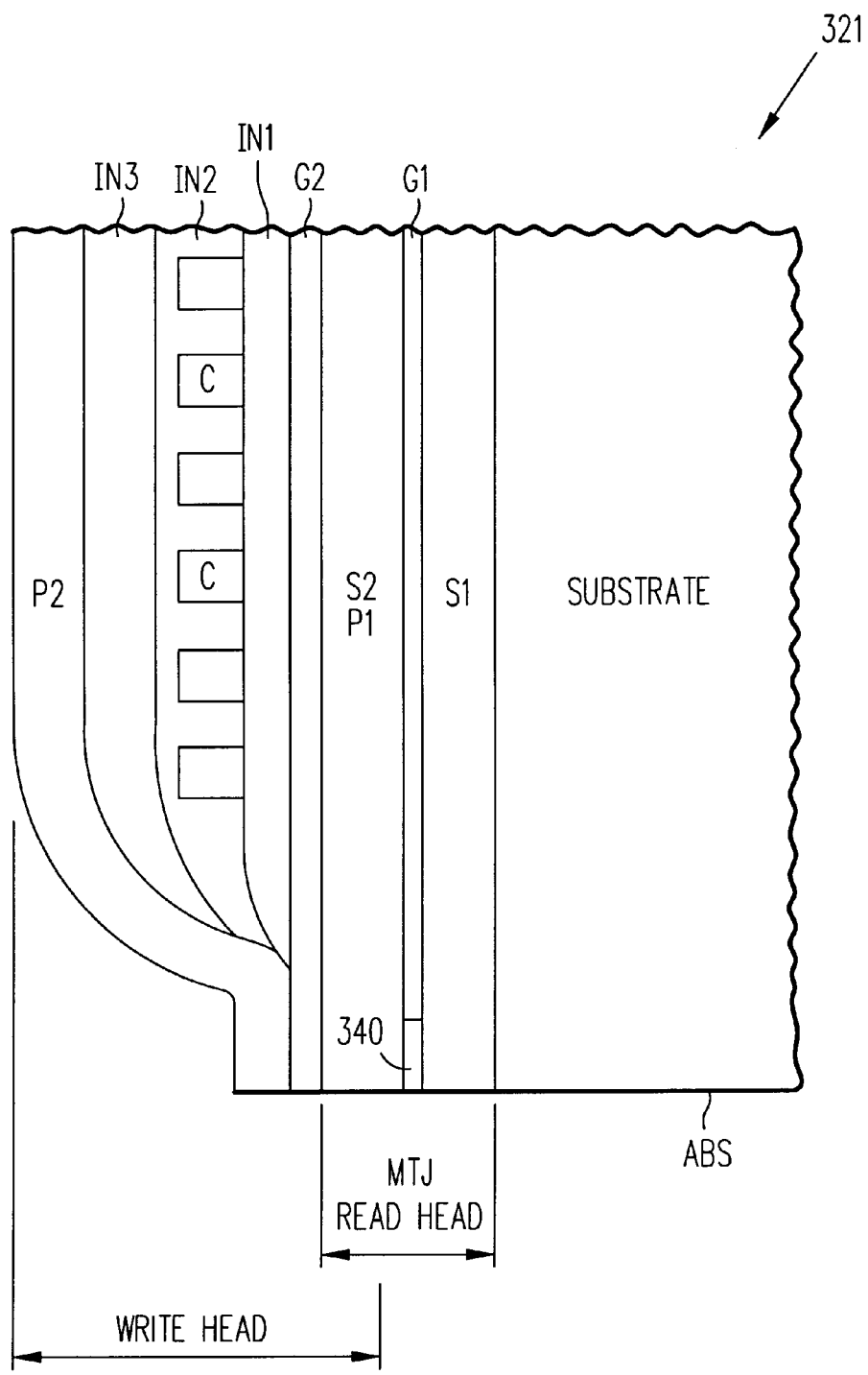
FIG. 3b is a vertical cross-section view, not to scale, of an inductive write/MTJ read head with the MTJ read head located between the shields and adjacent to the inductive write head.

FIG. 3b shows a cross-sectional schematic view of the read/write head 321 embodying the present invention which includes an MTJ read head portion and an inductive write head portion. The head 321 is lapped to form an ABS. The read head includes an MTJ sensor 340 disposed between first and second shield layers Si and S2. An insulating gap layer G1 is disposed between the first and second shield layers S1 and S2 in the region away from the MTJ sensor. The write head includes a coil layer C and an insulation layer IN2 which are disposed between insulation layers IN1 and IN3 which are, in turn, disposed between first and second pole pieces P1 and P2. A gap layer G2 is disposed between the first and second pole pieces P1, P2 for providing a magnetic write gap at their pole tips adjacent to the ABS. The combined read/write head 321 shown in FIG. 3b is a "merged" head in which the second shield layer S2 of the read head is employed as a first pole piece P1 for the write head.

Figure 4A:
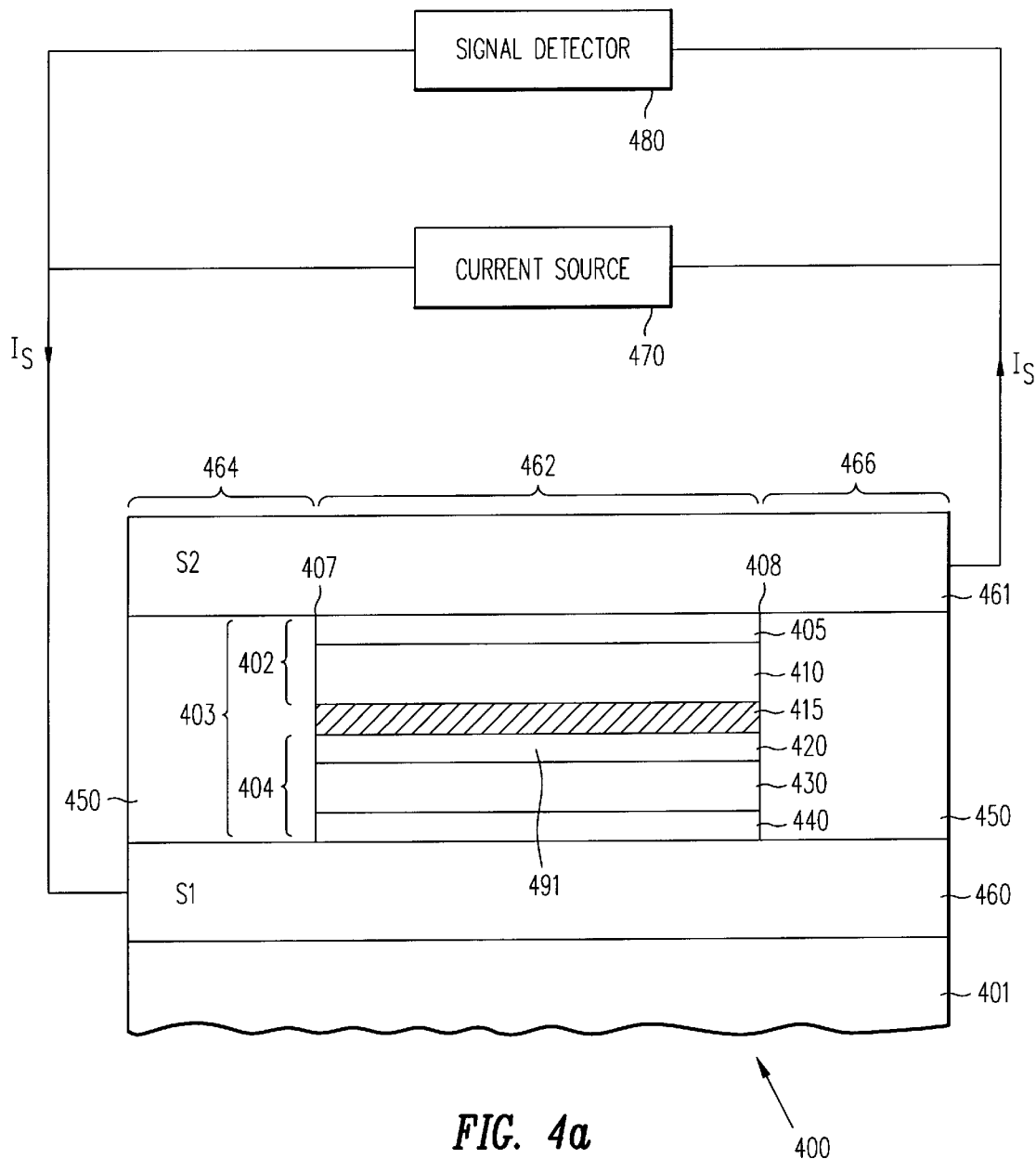
FIG. 4a is an air bearing surface view, not to scale, of an embodiment of the magnetic tunnel junction sensor of the present invention.

FIG. 4a shows an air bearing surface (ABS) view of an MTJ sensor 400 according to the preferred embodiment of the present invention. The MTJ sensor 400 comprises end regions 464 and 466 separated from each other by a central region 462. The active region of the MTJ sensor 400 is an MTJ sensor stripe 403 formed in the central region 462. The MTJ sensor stripe 403 has a generally rectangular shape with two opposite side edges 407, 408 and a back edge (not shown) opposite to a front edge 491 at the ABS. The MTJ sensor stripe 403 comprises a first electrode 404, a second electrode 402 and a tunnel barrier layer 415 disposed between the first electrode 404 and the second electrode 402. The first electrode 404 comprises a pinned layer 420, an AFM layer 430, and a seed layer 440, where the pinned layer 420 is disposed between the tunnel barrier layer 415 and the AFM layer 430 and the AFM layer 430 is disposed between the pinned layer 420 and the seed layer 440. The second electrode 402 comprises a free layer 410 and a cap layer 405, where the free layer 410 is disposed between the tunnel barrier layer 415 and the cap layer 405.

The AFM layer 430 is exchange coupled to the pinned layer 420 providing an exchange field to pin the magnetization direction of the pinned layer 420 perpendicular to the ABS. The magnetization of the free layer 410 is oriented parallel to the ABS and is free to rotate in the presence of a signal magnetic field.

In the preferred embodiment of the present invention, the MTJ sensor stripe 403 is formed in the central region 462 over a first shield (S1) 460. The first shield 460 is a layer of soft ferromagnetic material such as Ni—Fe (permalloy), or alternatively Al—Fe—Si (Sendust), deposited on a substrate 401 and extending over the central region 462 and the end regions 464 and 466 to provide magnetic shielding of the MTJ sensor from stray magnetic fields. An insulator layer 450 of electrically insulating material such as $Al_2O_3$ is formed in the end regions 464 and 466 and behind the back edge of the MTJ sensor stripe 403. A second shield (S2) 461 of soft ferromagnetic material such as Ni—Fe, or alternatively Al—Fe—Si, is formed on the insulator layer 450 in the end regions 464 and 466 and over the MTJ sensor stripe 403 in the central region 462.

Figure 4B:
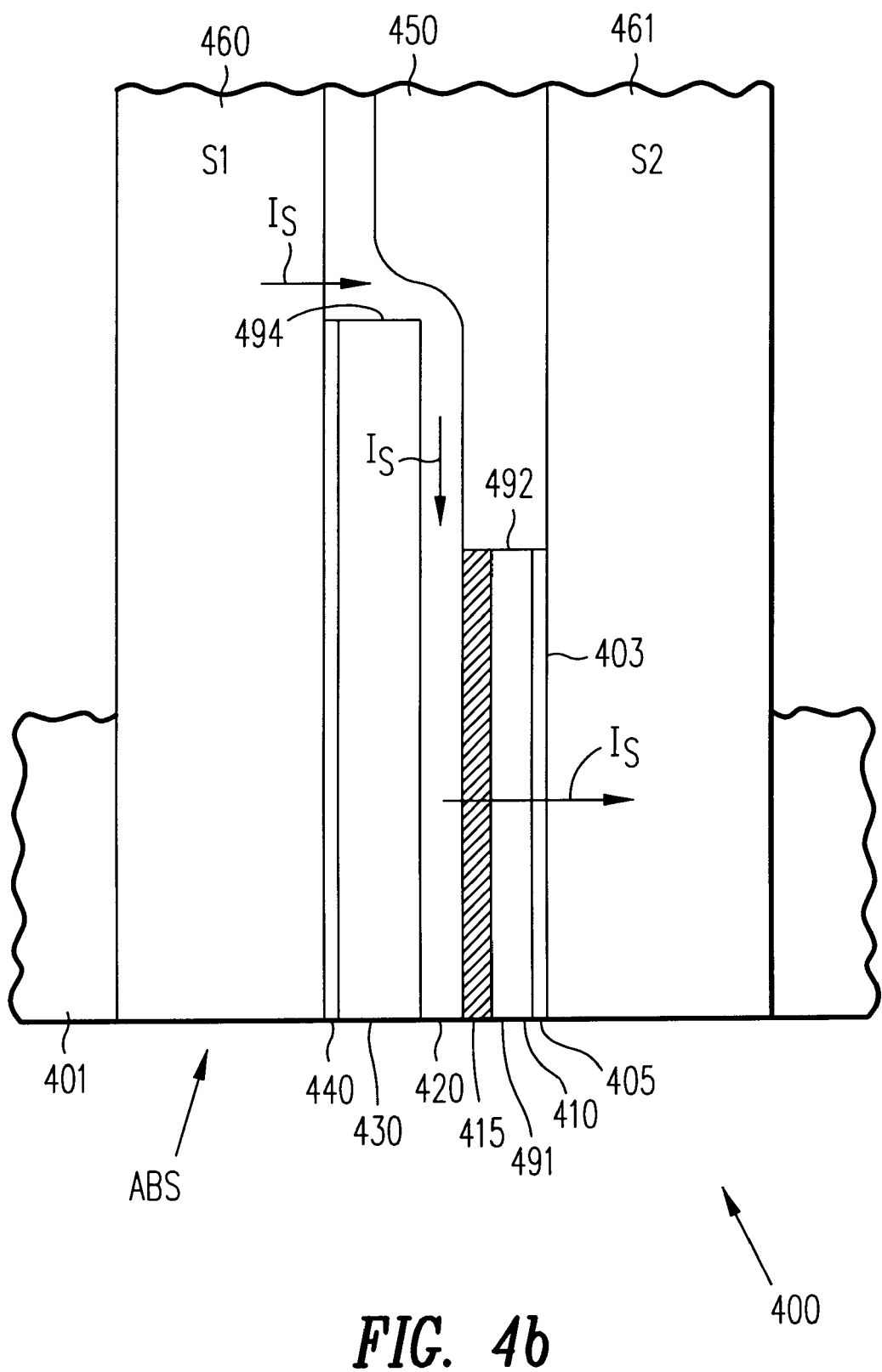
FIG. 4b is a cross-section, not to scale, perpendicular to the air bearing surface of the magnetic tunnel junction sensor of the present invention.

FIG. 4b shows the cross-section of the MTJ sensor 400 perpendicular to the ABS. The MTJ sensor stripe 403 has a front edge 491 at the ABS and extending away from the ABS to a back edge 492 defined by the back edges of the tunnel barrier layer 415. Because the AFM layer in the MTJ sensor of the present invention is formed of electrically insulating material, it is necessary to provide a path for the sensing current to bypass the AFM layer 430 and to flow perpendicular to the tunnel barrier layer 415. The path for sensing current flow is formed by patterning the AFM layer 430 to define an AFM back edge 494 significantly further away from the ABS than the MTJ sensor stripe back edge 492 and then depositing the pinned ferromagnetic layer 420 over the AFM layer 430 and over the exposed region of the first shield 460 further away from the ABS than the AFM back edge 494. The AFM back edge 494 may be patterned to be in the range of 10–50 micrometers away from the ABS while the MTJ sensor stripe back edge 492 is only about 0.5 micrometers away from the ABS. This structure provides a path for the flow of the sensing current $I_S$ from the first shield 460, into and along the plane of the pinned layer 420, and transversely through the tunnel barrier layer 415 and the free layer 410 to the second shield 461. The insulating layer 450 deposited over the pinned layer 420 beyond the MTJ sensor stripe back edge 492 provides electrical isolation between the first and second shields 460 and 461 and prevents the sensing current from shunting around the MTJ sensor stripe 403. Since the sensing current flows in the plane of the pinned layer 420, its magnetic field may be used to achieve a stable magnetic state in the free layer 410.

Referring again to FIG. 4a, the first and second shields 460 and 461 provide electrical connections for the flow of the sensing current $I_S$ from a current source 470 to the MTJ sensor stripe 403. A signal detector 480 which is electrically connected to shields 460 and 461 senses the change in the resistance due to changes induced in the free layer 410 by the external magnetic field (e.g., field generated by a data bit stored on a disk). The external magnetic field acts to rotate the direction of magnetization of the free layer 410 relative to the direction of magnetization of the pinned layer 420 which is preferably pinned perpendicular to the ABS. The signal detector 480 preferably includes a digital recording channel such as a partial response maximum-likelihood (PRML) channel as is known to those skilled in the art or other types of well known recording channels such as peak detect or maximum likelihood channels. The signal detector 480 also includes other supporting circuitries such as a preamplifier (electrically placed between the sensor and the channel) for conditioning the sensed resistance changes as is known to those skilled in the art.

The MTJ sensor 400 may be fabricated in a magnetron sputtering or an ion beam sputtering system to deposit sequentially the multilayer structure shown in FIGS. 4a and 4b. The first shield (S1) 460 of Ni—Fe (permalloy) having a thickness in the range of about 5000–10000 Å is deposited on the substrate 401. The seed layer 440, the AFM layer 430, the pinned layer 420, the tunnel barrier layer 415, the free layer 410, and the cap layer 405 are sequentially deposited over the first shield 460 in the presence of a longitudinal or transverse magnetic field of about 40 Oe to orient the easy axis of all of the ferromagnetic layers. The seed layer 440 is a layer deposited to modify the crystallographic texture or grain size of the subsequent layers, and may not be needed depending on the material of the subsequent layer. If used, the seed layer may be formed of tantalum (Ta), zirconium (Zr), nickel-iron (Ni—Fe), or $Al_2O_3$ having a thickness of about 30–50 Å. The AFM layer 430 formed of NiO having a thickness of about 100–400 Å is deposited on the seed layer 440 by sputtering a nickel target in the presence of a reactive gas that includes oxygen. The AFM layer 430 is patterned by photolithography to define the AFM back edge 494. The ferromagnetic pinned layer 420 is deposited on the AFM layer 430 and on the area of the first shield 460 exposed by the patterning of the AFM back edge 494. The pinned layer 420 may be formed of Ni—Fe having a thickness in the range of about 20–50 Å, or alternatively, may be formed of a sub-layer of Ni—Fe having a thickness in the range of 20–50 Å and an interface layer of Co having a thickness of about 5 Å deposited on the Ni—Fe sublayer. The tunnel barrier layer 415 is formed of $Al_2O_3$ by depositing and then plasma oxidizing an 8–20 Å aluminum (Al) layer on the pinned layer 420. The ferromagnetic free layer 410 may be formed of Ni—Fe having a thickness in the range of about 20–50 Å, or alternatively, may be formed of an interface layer of Co having a thickness of about 5 Å deposited on the tunnel barrier layer 415 and a sub-layer of Ni—Fe having a thickness of about 20–50 Å deposited on the Co interface layer. The cap layer 405 formed of Ta having a thickness of about 50 Å is deposited on the free layer 410. A photoresist layer is deposited on the cap layer 405 and photolithography and ion milling processes well known in the art may be used to define the back edge 492 and the central region 462 of the MTJ sensor stripe 403.

The insulator layer 450 can now be deposited on the exposed portion of the pinned layer 420 in the area behind the MTJ stripe back edge 492 and on the first shield (S1) 460 in the end regions 464, 466. The insulator layer 450 is formed of $Al_2O_3$ by depositing and then plasma oxidizing an aluminum (Al) layer having a thickness approximately equal to the total thickness of the MTJ sensor active layers in the central region 462. The photoresist protecting the MTJ sensor stripe 403 is then removed and the second shield 461 of Ni—Fe (permalloy) having a thickness in the range of about 5000–10000 Å is deposited on the exposed MTJ sensor stripe 403 and on the insulator layer 450.

The second shield 461 makes electrical contact to the second electrode 402. The free ferromagnetic layer 410 is separated from the second shield 461 by the thin cap layer 405 to break magnetic coupling between the free layer 410 and the second shield 461.

Figure 5A:
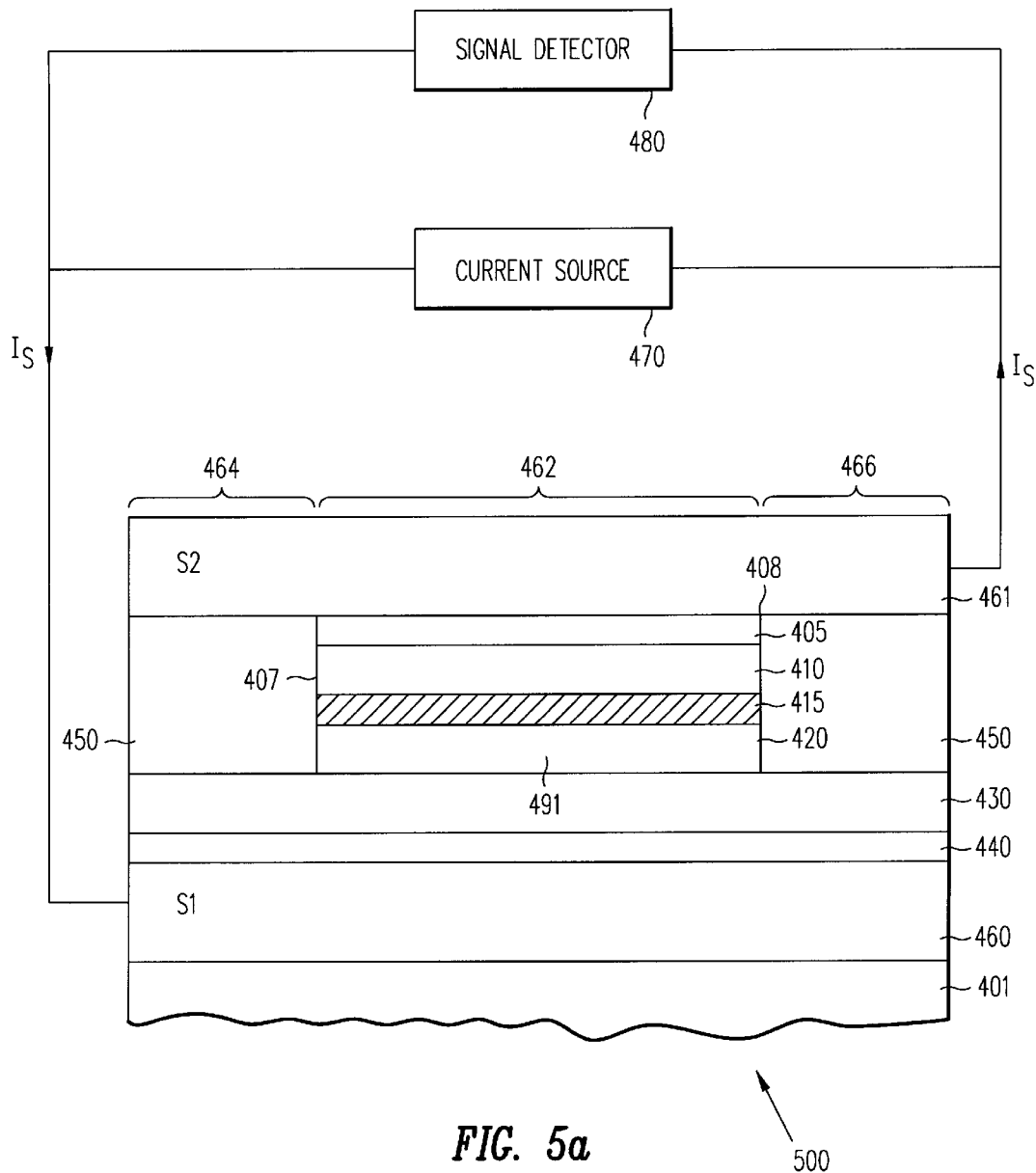
FIG. 5a is an air bearing surface view, not to scale, of another embodiment of the magnetic tunnel junction sensor of the present invention.

FIG. 5a shows an ABS view of an MTJ sensor 500 according to another embodiment of the present invention. This embodiment only differs from the embodiment shown in FIGS. 4a and 4b in having the seed layer 440 and the AFM layer 430 extend over the first shield (S1) 460 in the end regions 464 and 466 as well as in the central region 462. Since the AFM layer 430 is made of an electrically insulating AFM material, such as NiO, the AFM layer 430 in the end regions 464, 466 provides electrical insulation between the first shield (S1) 460 and the second shield (S2) 461 which together with the insulating layer 450 prevents electrical shorting between S1 and S2. The structure at the back edge of the MTJ sensor and the method of making electrical contact of the pinned layer 420 to the first shield (S1) 460 to provide a sensing current path may be the same as shown in FIG. 4b for the preferred embodiment or, alternatively, may have the structure and method of making electrical contact shown in FIG. 5b.

Figure 5B:
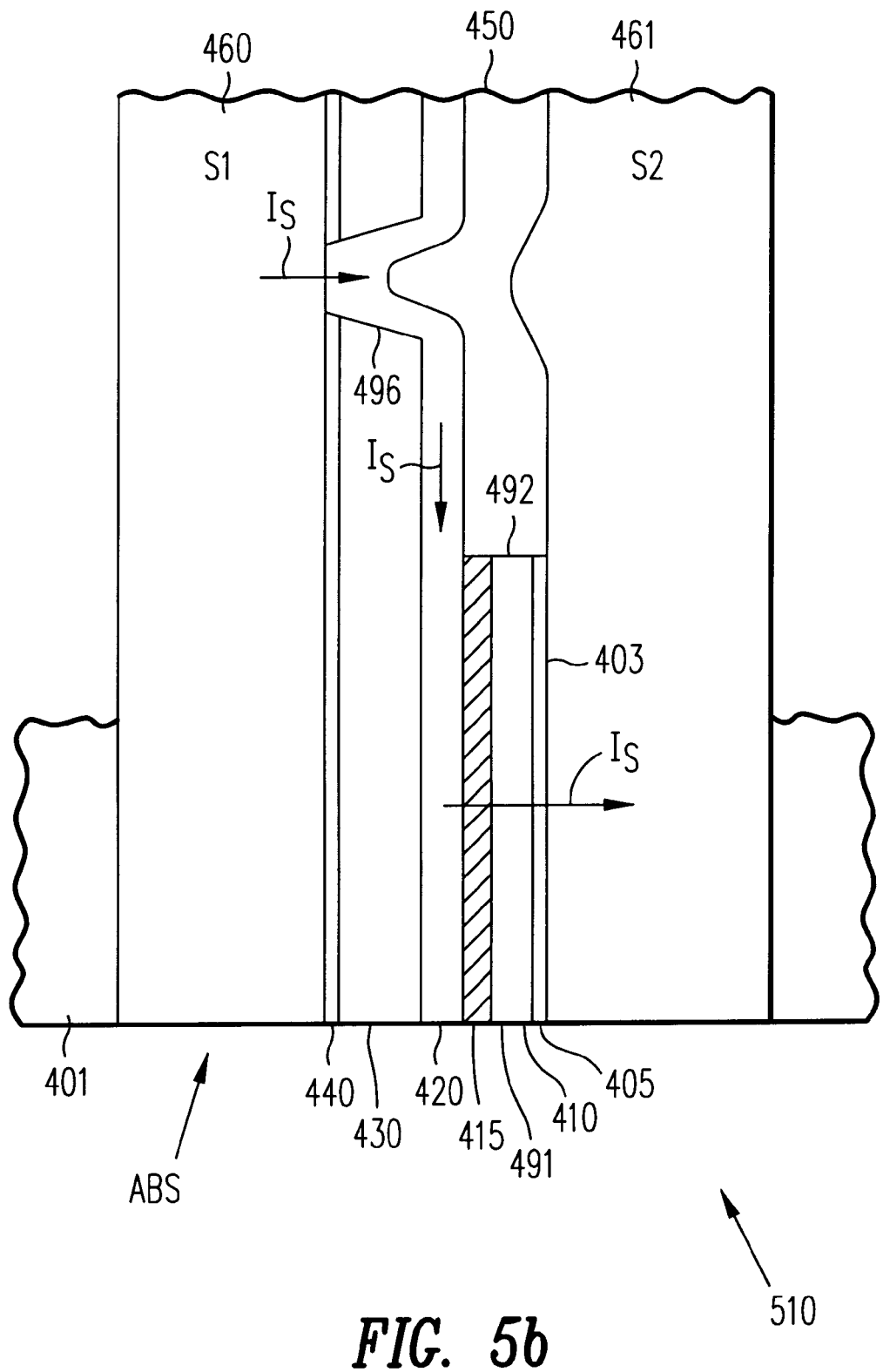
FIG. 5b is a cross-section, not to scale, perpendicular to the air bearing surface of yet another embodiment of the magnetic tunnel junction sensor of the present invention.

FIG. 5b shows the cross-section of an MTJ sensor 510 perpendicular to the ABS according to yet another embodiment of the present invention. In this embodiment, the seed layer 440 and the AFM layer 430 deposited on the first shield (S1) extend away from the ABS over the first shield (S1). Since the AFM layer 430 is formed of electrically insulating material, it is necessary to provide a path for the sensing current $I_S$ to bypass the AFM layer 430 and to flow in a direction perpendicular to the tunnel barrier layer 415. The path for the sensing current flow is made by forming an opening (via) 496 through the AFM layer 430 prior to the deposition of the pinned layer 420 over the AFM layer 430. The via 496 is formed in the region of the AFM layer 430 further away from the ABS than the MTJ sensor stripe back edge 492 using methods well known to the art. The pinned layer 420 is deposited on the AFM layer 430 and on the area of the first shield (S1) 460 exposed by the via 496 through the AFM layer 430. The pinned layer 420 makes electrical contact to the first shield (S1) 460 through the via 496 providing a path for the flow of the sensing current $I_S$ from the first shield (S1) 460, into and along the plane of the pinned layer, and transversely through the tunnel barrier layer 415 and the free layer 410 to the second shield (S2) 461. The insulating layer 450 deposited over the pinned layer 420 beyond the MTJ stripe back edge 492 provides electrical isolation between the first and second shields 460 and 461 and prevents the sensing current from shunting around the MTJ sensor stripe 403.

Alternatively, AFM layer 430 may be made of an α-Fe$_2$O$_3$/NiO bilayer to fabricate the MTJ sensor 400 according to the present invention.

While the present invention has been particularly shown and described with reference to the preferred embodiments, it will be understood by those skilled in the art that various changes in form and detail may be made without departing from the spirit, scope and teaching of the invention. Accordingly, the disclosed invention is to be considered merely as illustrative and limited in scope only as specified in the appended claims.

We claim:

1. A magnetic tunnel junction (MTJ) sensor, comprising:
   a substrate;
   a first shield (S1) of ferromagnetic material formed on the substrate;
   a magnetic tunnel junction (MTJ) sensor stripe formed on said first shield, the MTJ sensor stripe having a generally rectangular shape and having two opposite side edges, a back edge and a front edge, said MTJ sensor stripe comprising:
      an antiferromagnetic (AFM) layer of electrically insulating antiferromagnetic material;
      a pinned layer of ferromagnetic material in contact with said AFM layer, said pinned layer making electrical contact with said first shield;
      a free layer of ferromagnetic material;
      a tunnel junction layer of electrically insulating material disposed between said pinned and free layers;
   a second shield (S2) of ferromagnetic material formed on and in contact with said MTJ sensor stripe; and
   an insulator layer formed on the first shield on opposite sides of said MTJ sensor stripe and on said pinned layer beyond the back edge of said MTJ sensor stripe, said insulator layer separating said first shield and said pinned layer from said second shield.

2. The MTJ sensor as recited in claim 1, wherein said AFM layer is made of NiO.

3. The MTJ sensor as recited in claim 1, wherein said insulator layer is made of Al$_2$O$_3$.

4. The MTJ sensor as recited in claim 1, wherein said first shield is made of Ni—Fe.

5. The MTJ sensor as recited in claim 1, wherein said second shield is made of Ni—Fe.

6. The MTJ sensor as recited in claim 1, further comprising:
   a signal detector;
   a current source for providing a sensing current;
   a first electrical connection for connecting said first shield to the current source and to the signal detector; and
   a second electrical connection for connecting said second shield to the current source and to the signal detector;
said first and second shields providing electrical leads for sensing the electrical resistance to the sensing current flowing perpendicularly through the tunnel barrier layer and the free layer, said sensing current flow prevented from shunting around said MTJ sensor stripe by said insulator layer.

7. The MTJ sensor as recited in claim 1, wherein said AFM layer is made of α-Fe$_2$O$_3$/NiO.

8. A disk drive system, comprising:
   a magnetic recording disk;
   a magnetic tunnel junction (MTJ) sensor for sensing magnetically recorded data on said magnetic recording disk, said MTJ sensor comprising:
      a substrate;
      a first: shield (S1) of ferromagnetic material formed on the substrate;
      a magnetic tunnel junction (MTJ) sensor stripe formed on the first shield, the MTJ sensor stripe having a generally rectangular shape and having two opposite side edges, a rear edge and a front edge, said MTJ sensor stripe comprising:
         an antiferromagnetic (AFM) layer of electrically insulating antiferromagnetic material;
         a pinned layer of ferromagnetic material in contact with said AFM layer, said pinned layer making electrical contact with said first shield;
         a free layer of ferromagnetic material; and
         a tunnel junction layer of electrically insulating material disposed between said pinned and free layers;
      a second shield (S2) of ferromagnetic material formed on and in contact with said MTJ sensor stripe; and
      an insulator layer formed on the first shield on opposite sides of said MTJ sensor stripe and on said pinned layer beyond the back edge of said MTJ sensor stripe, said insulator layer separating said first shield and said pinned layer from said second shield;
   an actuator for moving said MTJ sensor across the magnetic recording disk so the MTJ sensor may access different regions of magnetically recorded data on the magnetic recording disk; and
   a recording channel coupled electrically to the MTJ sensor for detecting changes in resistance of the MTJ sensor caused by rotation of the magnetization axis of the free ferromagnetic layer relative to the fixed magnetization of the pinned layer in response to magnetic fields from the magnetically recorded data.

9. The disk drive system as recited in claim 8, wherein said AFM layer is made of NiO.

10. The disk drive system as recited in claim 8, wherein said insulator layer is made of Al$_2$O$_3$.

11. The disk drive system as recited in claim 8, wherein said first shield is made of Ni—Fe.

12. The disk drive system as recited in claim 8, wherein said second shield is made of Ni—Fe.

13. The disk drive system as recited in claim 8, further comprising:
   a signal detector;
   a current source for providing a sensing current;
   a first electrical connection for connecting said first shield to the current source and to the signal detector; and
   a second electrical connection for connecting said second shield to the current source and to the signal detector;
said first and second shields providing electrical leads for sensing the electrical resistance to the sensing current flowing perpendicularly through the tunnel barrier layer and the free layer, said sensing current flow prevented from shunting around said MTJ sensor stripe by said insulator layer.

14. The MTJ sensor as recited in claim 8, wherein said AFM layer is made of α-Fe$_2$O$_3$/NiO.

15. A magnetic tunnel junction (MTJ) sensor, comprising:
   a substrate;
   a first shield (S1) of ferromagnetic material formed on the substrate;
   a magnetic tunnel junction (MTJ) sensor stripe formed on said first shield, the MTJ sensor stripe having a generally rectangular shape and having two opposite side edges, a back edge and a front edge, said front edge located at an air bearing surface, said MTJ sensor stripe comprising:
an antiferromagnetic (AFM) layer of electrically insulating antiferromagnetic material;
a pinned layer of ferromagnetic material in contact with said AFM layer, said pinned layer making electrical contact with said first shield;
a free layer of ferromagnetic material;
a tunnel junction layer of electrically insulating material disposed between said pinned and free layers;
a second shield (S2) of ferromagnetic material formed on and in contact with said MTJ sensor stripe; and
an insulator layer formed on the first shield on opposite sides of said MTJ sensor stripe and on said pinned layer beyond the back edge of said MTJ sensor stripe, said insulator layer separating said first shield and said pinned layer from said second shield.

16. The MTJ sensor as recited in claim 15, wherein said AFM layer is made of NiO.

17. The MTJ sensor as recited in claim 15, wherein said insulator layer is made of $Al_2O_3$.

18. The MTJ sensor as recited in claim 15, wherein said first shield is made of Ni—Fe.

19. The MTJ sensor as recited in claim 15, wherein said second shield is made of Ni—Fe.

20. The MTJ sensor as recited in claim 15, further comprising:
a signal detector;
a current source for providing a sensing current;
a first electrical connection for connecting said first shield to the current source and to the signal detector; and
a second electrical connection for connecting said second shield to the current source and to the signal detector;
said first and second shields providing electrical leads for sensing the electrical resistance to the sensing current flowing perpendicularly through the tunnel barrier layer and the free layer, said sensing current flow prevented from shunting around said MTJ sensor stripe by said insulator layer.

21. The MTJ sensor as recited in claim 15, wherein said AFM layer is made of $\alpha\text{-}Fe_2O_3$/NiO.

22. A magnetic tunnel junction (MTJ) sensor, comprising:
a substrate;
a first shield (S1) of ferromagnetic material formed on the substrate;
a magnetic tunnel junction (MTJ) sensor stripe formed on said first shield, the MTJ sensor stripe having a generally rectangular shape and having two opposite side edges, a back edge and a front edge, said front edge located at an air bearing surface (ABS), said MTJ sensor stripe comprising:
an antiferromagnetic (AFM) layer of electrically insulating antiferromagnetic material, said AFM layer having a front edge at the ABS and a back edge further from the ABS than said back edge of the MTJ sensor stripe;
a pinned layer of ferromagnetic material in contact with said AFM layer, said pinned layer extending further from the ABS than said back edge of the AFM layer, said pinned layer making electrical contact with said first shield in a region further from the ABS than said back edge of the AFM layer;
a free layer of ferromagnetic material;
a tunnel junction layer of electrically insulating material disposed between said pinned and free layers;
a second shield (S2) of ferromagnetic material formed on and in contact with said MTJ sensor stripe; and
an insulator layer formed on the first shield on opposite sides of said MTJ sensor stripe and on said pinned layer beyond the back edge of said MTJ sensor stripe, said insulator layer separating said first shield and said pinned layer from said second shield.

23. The MTJ sensor as recited in claim 22, wherein said AFM layer is made of NiO.

24. The MTJ sensor as recited in claim 22, wherein said insulator layer is made of $Al_2O_3$.

25. The MTJ sensor as recited in claim 22, wherein said first shield is made of Ni—Fe.

26. The MTJ sensor as recited in claim 22, wherein said second shield is made of Ni—Fe.

27. The MTJ sensor as recited in claim 22, further comprising:
a signal detector;
a current source for providing a sensing current;
a first electrical connection for connecting said first shield to the current source and to the signal detector; and
a second electrical connection for connecting said second shield to the current source and to the signal detector;
said first and second shields providing electrical leads for sensing the electrical resistance to the sensing current flowing perpendicularly through the tunnel barrier layer and the free layer, said sensing current flow prevented from shunting around said MTJ sensor stripe by said insulator layer.

28. The MTJ sensor as recited in claim 22, wherein said AFM layer is made of $\alpha\text{-}Fe_2O_3$/NiO.

29. A magnetic tunnel junction (MTJ) sensor, comprising:
a substrate;
a first shield (S1) of ferromagnetic material formed on the substrate;
a magnetic tunnel junction (MTJ) sensor stripe formed on said first shield, the MTJ sensor stripe having a generally rectangular shape and having two opposite side edges, a back edge and a front edge, said front edge located at an air bearing surface (ABS), said MTJ sensor stripe comprising:
an antiferromagnetic (AFM) layer of electrically insulating antiferromagnetic material, said AFM layer having a front edge at the ABS and said AFM layer extending away from the ABS over said first shield, said AFM layer having an opening (via) through the AFM layer in a region further from the ABS than said back edge of the MTJ sensor stripe;
a pinned layer of ferromagnetic material in contact with said AFM layer, said pinned layer making electrical contact with said first shield through said opening (via) through the AFM layer;
a free layer of ferromagnetic material;
a tunnel junction layer of electrically insulating material disposed between said pinned and free layers;
a second shield (S2) of ferromagnetic material formed on and in contact with said MTJ sensor stripe; and
an insulator layer formed on the first shield on opposite sides of said MTJ sensor stripe and on said pinned layer beyond the back edge of said MTJ sensor stripe, said insulator layer separating said first shield and said pinned layer from said second shield.

30. The MTJ sensor as recited in claim 29, wherein said AFM layer is made of NiO.

31. The MTJ sensor as recited in claim 29, wherein said insulator layer is made of $Al_2O_3$.

32. The MTJ sensor as recited in claim 29, wherein said first shield is made of Ni—Fe.

33. The MTJ sensor as recited in claim 29, wherein said second shield is made of Ni—Fe.

34. The MTJ sensor as recited in claim 29, further comprising:

a signal detector;

a current source for providing a sensing current;

a first electrical connection for connecting said first shield to the current source and to the signal detector; and a second electrical connection for connecting said second shield to the current source and to the signal detector; said first and second shields providing electrical leads for sensing the electrical resistance to the sensing current flowing perpendicularly through the tunnel barrier layer and the free layer, said sensing current flow prevented from shunting around said MTJ sensor stripe by said insulator layer.

35. The MTJ sensor as recited in claim 29, wherein said AFM layer is made of $\alpha\text{-}Fe_2O_3/NiO$.

* * * * *